(12) United States Patent
Hwang et al.

(10) Patent No.: US 11,719,973 B2
(45) Date of Patent: *Aug. 8, 2023

(54) DISPLAY DEVICE

(71) Applicant: Samsung Display Co., Ltd., Yongin-si (KR)

(72) Inventors: Hyunmin Hwang, Yongin-si (KR); Jaekyung Go, Yongin-si (KR); Dongjo Kim, Yongin-si (KR); Youngmin Kim, Yongin-si (KR); Chanyoung Park, Yongin-si (KR); Dongwon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

This patent is subject to a terminal disclaimer.

(21) Appl. No.: 17/409,677

(22) Filed: Aug. 23, 2021

(65) Prior Publication Data
US 2021/0382345 A1 Dec. 9, 2021

Related U.S. Application Data

(63) Continuation of application No. 16/549,691, filed on Aug. 23, 2019, now Pat. No. 11,099,418.

(30) Foreign Application Priority Data

Oct. 23, 2018 (KR) .................. 10-2018-0126864

(51) Int. Cl.
*G02F 1/1335* (2006.01)
*H01L 51/52* (2006.01)
(Continued)

(52) U.S. Cl.
CPC ...... *G02F 1/133512* (2013.01); *G02F 1/1339* (2013.01); *G02F 1/136209* (2013.01); *H10K 50/841* (2023.02); *H10K 59/126* (2023.02)

(58) Field of Classification Search
None
See application file for complete search history.

(56) References Cited

U.S. PATENT DOCUMENTS 8,518,727 B2  8/2013  Ryu et al.
8,717,513 B2  5/2014  Park et al.
(Continued)

FOREIGN PATENT DOCUMENTS

KR  10-1084264  11/2011
KR  10-1353270  1/2014
(Continued)

OTHER PUBLICATIONS

Non-Final Office Action dated Oct. 7, 2020, in U.S. Appl. No. 16/549,691.
(Continued)

*Primary Examiner* — Robert K Carpenter
(74) *Attorney, Agent, or Firm* — H.C. Park & Associates, PLC

(57) ABSTRACT

A display device including a substrate; a sealing member surrounding a part of a transmission area of the substrate; a plurality of pixels in a display area of the substrate; an encapsulation substrate facing the substrate with the sealing member between the encapsulation substrate and the substrate; a transparent material layer between the substrate and the encapsulation substrate and corresponding to the transmission area; and a light-shielding portion on the encapsulation substrate and corresponding to the sealing member. A width of the light-shielding portion is greater than a width of the sealing member.

20 Claims, 14 Drawing Sheets

(51) Int. Cl.
*G02F 1/1339* (2006.01)
*G02F 1/1362* (2006.01)
*H10K 50/84* (2023.01)
*H10K 59/126* (2023.01)

(56) References Cited

U.S. PATENT DOCUMENTS

| | | |
|---|---|---|
| 9,395,569 B2 | 7/2016 | Kim et al. |
| 11,099,418 B2 * | 8/2021 | Hwang ............. G02F 1/133512 |
| 2014/0071368 A1 | 3/2014 | Kim et al. |
| 2016/0093596 A1 | 3/2016 | Hong et al. |
| 2016/0307922 A1 | 10/2016 | Kim et al. |
| 2017/0287992 A1 | 10/2017 | Kwak et al. |

FOREIGN PATENT DOCUMENTS

| | | |
|---|---|---|
| KR | 10-1754075 | 7/2017 |
| KR | 10-2017-0111827 | 10/2017 |
| KR | 10-2017-0137230 | 12/2017 |
| KR | 10-1813459 | 1/2018 |

OTHER PUBLICATIONS

Notice of Allowance dated Apr. 7, 2021, in U.S. Appl. No. 16/549,691.

* cited by examiner

DISPLAY DEVICE

CROSS REFERENCE TO RELATED APPLICATION

This application is a Continuation of U.S. patent application Ser. No. 16/549,691, filed on Aug. 23, 2019, which claims priority from and the benefit of Korean Patent Application No. 10-2018-0126864, filed on Oct. 23, 2018, which are hereby incorporated by reference for all purposes as if fully set forth herein.

BACKGROUND

Field

Exemplary embodiments of the invention relate generally to a display device.

Discussion Of The Background

Recently, display devices have become very versatile. Also, as display devices have increasingly smaller thicknesses and lighter weights, they may be used in wider ranges of applications. As the area of a display area of a display device is enlarged, a variety of combined or connecting functions are being added to the display device.

The above information disclosed in this Background section is only for understanding of the background of the inventive concepts, and, therefore, it may contain information that does not constitute prior art.

SUMMARY

As a scheme for adding a variety of functions to a display device by enlarging the area of a display area, a transmission region may be formed on a part of the display area. Exemplary embodiments of the present invention provide a display device having a transmission region and including the above-described structure.

Additional features of the inventive concepts will be set forth in the description which follows, and in part will be apparent from the description, or may be learned by practice of the inventive concepts.

An exemplary embodiment of the present invention provides a display device including: a substrate; a sealing member surrounding a part of a transmission area of the substrate; a plurality of pixels positioned in a display area of the substrate; an encapsulation substrate facing the substrate in a state in which the sealing member is located between the encapsulation substrate and the substrate; a transparent material layer disposed between the substrate and the encapsulation substrate and corresponding to the transmission area; and a light-shielding portion positioned on the encapsulation substrate and corresponding to the sealing member. A width of the light-shielding portion is greater than a width of the sealing member.

The light-shielding portion of the window may entirely surround the transmission area.

A side surface of the transparent material layer may be exposed outside and be between an edge of the substrate and an edge of the encapsulation substrate that are adjacent to the transmission area.

An outer side surface of a first portion of the sealing member that is between an edge of the substrate and the display area may have a different shape from a shape of an outer side surface of a second portion of the sealing member that is between the display area and the transmission area.

A side surface of the substrate that correspond to edges of the substrate and a side surface of the encapsulation substrate that correspond to edges of the encapsulation substrate may have a convex surface, and the outer side surface of the first portion of the sealing member may have a continuously curved feature with the convex surfaces.

The display device may further include a power line positioned between the display area and the transmission area.

The sealing member may overlap the power line.

The transparent material layer may be in direct contact with the encapsulation substrate.

The display device may further include an inorganic layer interposed between the substrate and the transparent material layer.

The substrate and the transparent material layer may be in direct contact with each other.

The plurality of pixels may include a first pixel and a second pixel that are arranged in an imaginary line that passes through the transmission area and spaced apart from each other with the transmission area between the first pixel and the second pixel.

The display device may further include at least one of an antireflection member or adhesive layer interposed between the encapsulation substrate and the window. The at least one antireflection member or adhesive layer may include an opening that corresponds to the transmission area.

The display device may further include a transparent layer positioned in the opening.

Each of the plurality of pixels may include an organic light-emitting diode.

Another exemplary embodiment provides a display device including: a substrate; a sealing member partially surrounding a transmission area of the substrate; a plurality of pixels positioned in a display area of the substrate; an encapsulation substrate facing the substrate in a state in which the sealing member is located between the encapsulation substrate and the substrate; a transparent material layer disposed between the substrate and the encapsulation substrate and corresponding to the transmission area; and a window positioned on the encapsulation substrate. The sealing member may include a first portion that extends along edges of the substrate and a second portion that is connected to the first portion and extends between the transmission area and the display area so as to surround a part of the transmission area.

The transparent material layer may include an inner side surface facing the second portion of the sealing member and an outer side surface opposite to the inner side surface, and the outer side surface of the transparent material layer may be between an edge of the substrate and an edge of the encapsulation substrate and may be exposed to the outside.

The light-shielding portion of the window may include a first sub-light-shielding portion that overlaps the second portion of the sealing member and a second sub-light-shielding portion that extends in a different direction from a direction of the first sub-light-shielding portion, and the first sub-light-shielding portion and the second sub-light-shielding portion may be connected to each other so as to have a ring shape.

The second sub-light-shielding portion may not overlap the sealing member.

An outer side surface of the first portion of the sealing member may have a different shape from a shape of an outer side surface of the second portion of the sealing member.

A side surface of the substrate that corresponds to an edge of the substrate has a convex surface, a side surface of the encapsulation substrate that corresponds to an edge of the encapsulation substrate has a convex surface, and the outer side surface of the first portion of the sealing member has a continuously curved feature with the convex surfaces.

The display device may further include a power line positioned between the transmission area and the display area. The sealing member may overlap the power line.

Each of the substrate and the encapsulation substrate may be in direct contact with the transparent material layer.

The display device may further include: an antireflection member interposed between the encapsulation substrate and the window and having an opening that corresponds to the transmission area; and a transparent layer positioned in the opening.

The pixels may include an organic light-emitting diode or a liquid crystal.

Another exemplary embodiment of the present invention provides a display device including: a substrate having a transmission area and a display area that partially surrounds the transmission area; a plurality of display elements positioned in the display area; an encapsulation member covering the plurality of display elements; a window positioned on the encapsulation member and having a transmission portion corresponding to the transmission area and the display area, and a light-shielding portion surrounding the transmission portion.

The display device may further include an antireflection member interposed between the encapsulation member and the window. The antireflection member may include an opening that corresponds to the transmission area.

The display device may further include a transparent layer positioned in the opening and including a transparent material.

The encapsulation member may include: an encapsulation substrate facing the substrate in a state in which the display elements are positioned between the encapsulation substrate and the substrate; and a sealing member positioned between the substrate and the encapsulation substrate. The sealing member may partially surround the transmission area.

The display device may further include a transparent material layer positioned between the substrate and the encapsulation substrate and corresponding to the transmission area.

An outer side surface of a first portion of the sealing member that is between an edge of the substrate and an edge of the display area may have a different shape from a shape of an outer side surface of a second portion of the sealing member that is between the display area and the transmission area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
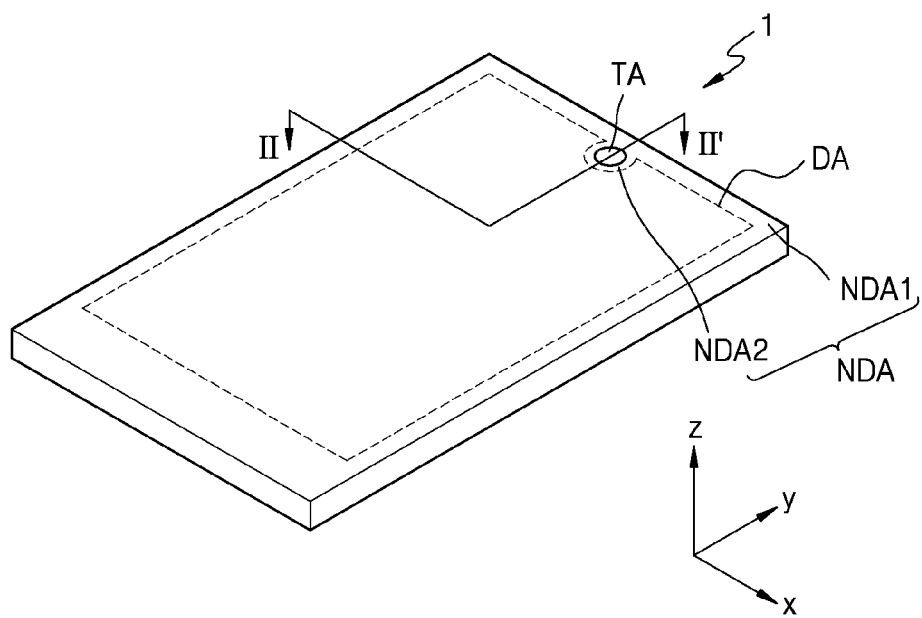
FIG. 1 is a perspective view schematically illustrating a display device according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display device according to an exemplary embodiment.

Referring to FIG. 1, a display device 1 includes a display area DA in which light is emitted and a non-display area NDA in which no light is emitted. The display device 1 may provide an image using light emitted from pixels in the display area DA.

The display device 1 includes a transmission area TA, which is at an edge of the display area DA and is partially surrounded by the display area DA. The transmission area TA, which is an area in which light is transmitted, corresponds to an area in which a component, such as a camera or sensor, etc., is located. The transmission area TA of the display device 1 may have transmissivity of about 90% or more, for example.

The non-display area NDA may surround the display area DA. A part of the non-display area NDA is between the display area DA and the transmission area TA. Hereinafter, for convenience, an area of the non-display area NDA between the display area DA and the transmittance area TA is referred to as a second non-display area NDA2, and the other area thereof is referred to as a first non-display area NDA1. The first non-display area NDA1 extends along edges of the display device 1, and the second non-display area NDA2 is connected to the first non-display area NDA1 and surrounds a part of the transmission area TA. The transmission area TA may be entirely surrounded by a part of the first non-display area NDA1 and the second non-display area NDA2 that are connected to each other.

Hereinafter, the display device 1 according to an exemplary embodiment will be is described as an organic light-emitting display device. However, the display device according to is the inventive concepts are not limited thereto. In another exemplary embodiment, a display device may be one of various kinds of display devices, such as an inorganic electro luminance (EL) display, a quantum dot light-emitting display, and a liquid crystal display (LCD).

Figure 2A:
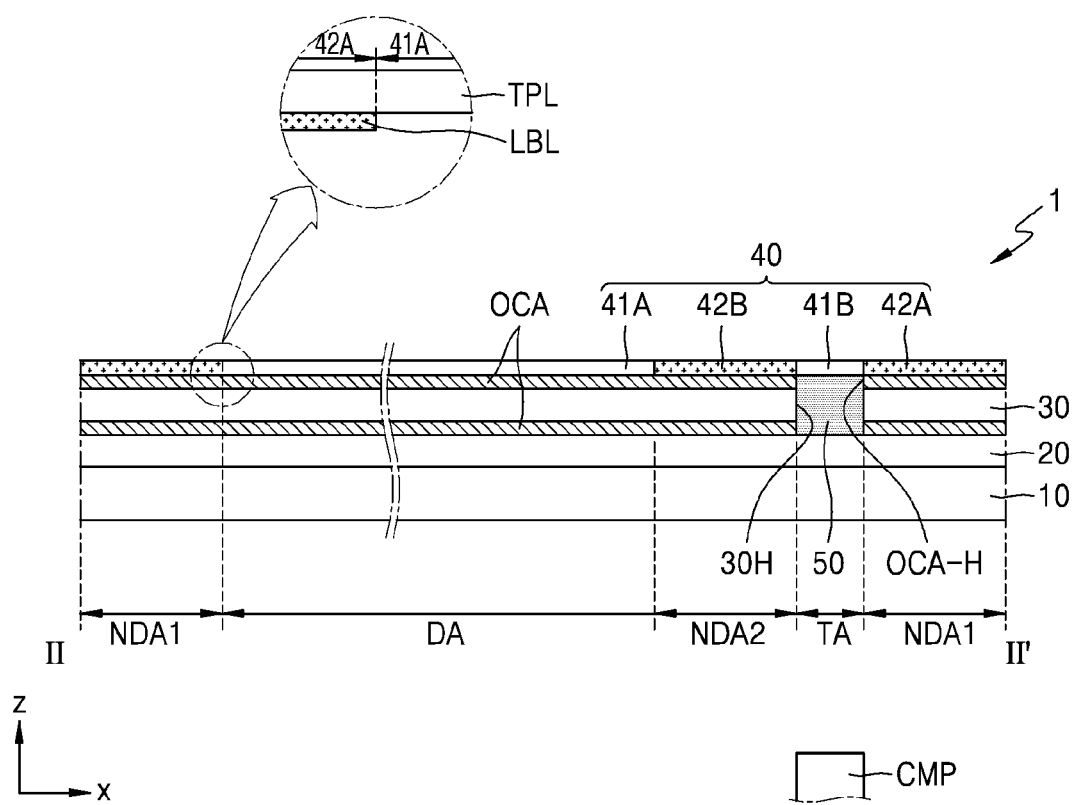
FIGS. 2A, 2B, and 2C are cross-sectional views of the display device according to exemplary embodiments, taken along a line II-II' of FIG. 1.
Figure 2B:
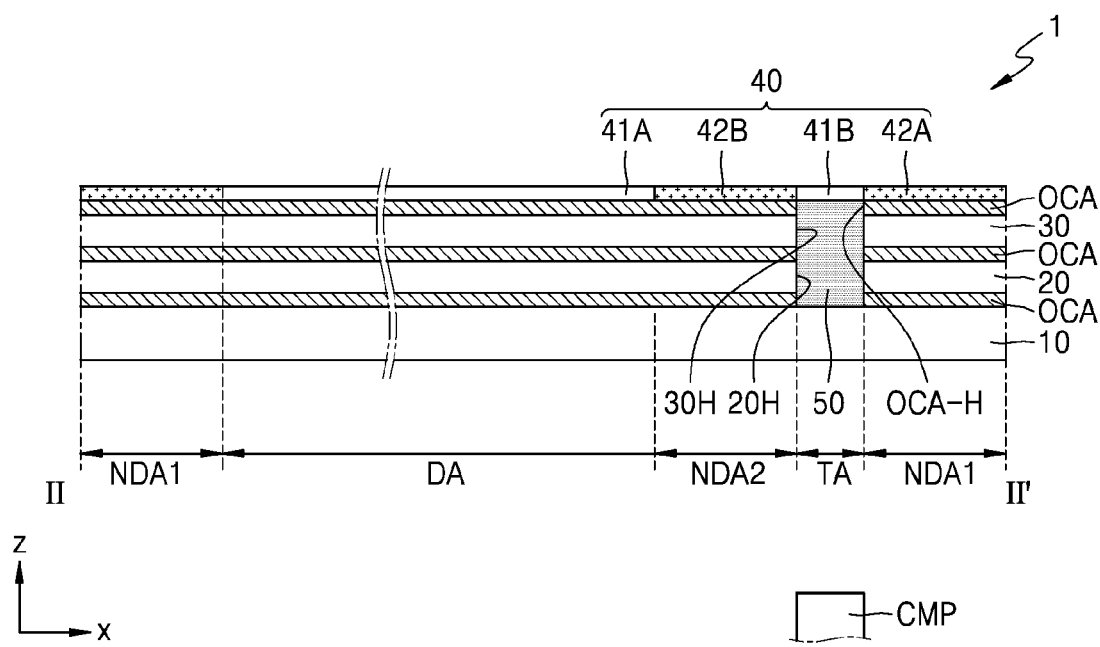
Figure 2C:
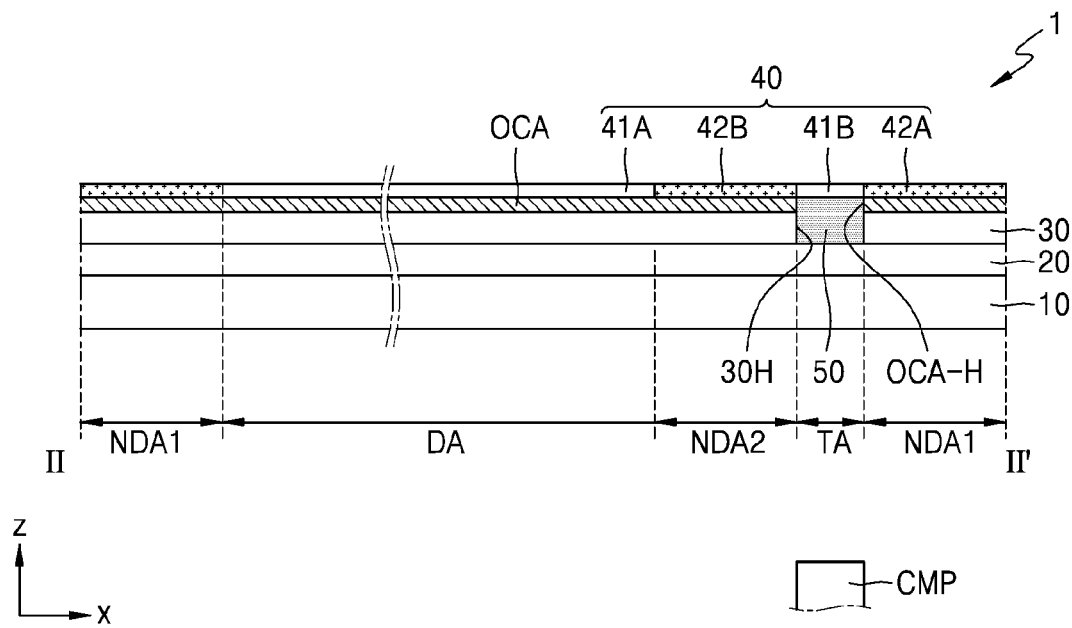

FIGS. 2A through 2C are cross-sectional views of the display device 1 according to an exemplary embodiment, taken along a line II-II' of FIG. 1.

Referring to FIGS. 2A through 2C, the display device 1 may include a display panel 10, an input sensing member 20, an antireflection member 30, and a window 40.

The display panel 10 generates an image. The display panel 10 includes pixels in the display area DA. Each pixel may include a display element and a pixel circuit connected thereto.

The input sensing member 20 attains coordinate information according to an external input, for example, a touch event. The input sensing member 20 may include a sensing electrode (or a touch electrode) and a trace line connected to the sensing electrode. The input sensing member 20 may be positioned on the display panel 10. Alternatively, although not shown, the input sensing member 20 may be positioned on the antireflection member 30.

A process of forming the input sensing member 20 may be performed continuously after a process of forming the display panel 10 is performed. In this case, as illustrated in FIGS. 2A and 2C, an adhesion member may not be interposed between the display panel 10 and the input sensing member 20. In another exemplary embodiment, a process of forming the input sensing member 20 may be performed separately from the process of forming the input sensing member 20. In this case, as illustrated in FIG. 2B, an adhesion member may be interposed between the input sensing member 20 and the display panel 10. FIG. 2B illustrates an optically clear adhesive (OCA) as an adhesion member.

The antireflection member 30 reduces reflectivity of light (external light) incident toward the display panel 10 from the outside through the window 40. The antireflection member 30 may be positioned on the input sensing member 20. Alternatively, the antireflection member 30 may be positioned under the input sensing member 20.

In an exemplary embodiment, the antireflection member 30 may include a retarder and a polarizer. The retarder may be of a film type retarder or liquid crystal coating type retarder. The retarder may include a λ/2 retarder and/or λ/4 retarder. The polarizer may also be of a film type polarizer or liquid crystal coating type polarizer. The film type polarizer may include a stretchable synthetic resin film, and the liquid crystal coating type polarizer may include liquid crystals arranged in a predetermined arrangement. Each of the retarder and the polarizer may further include a protection film. The retarder, the polarizer, or the protection film may be defined as a base layer of the antireflection member 30.

In another exemplary embodiment, the antireflection member 30 may include a black matrix and color filters. The color filters may be arranged considering colors of lights emitted from the pixels of the display panel 10. In another exemplary embodiment, the antireflection member 30 may include a destructive interference structure. The destructive interference structure may include a first reflection layer and a second reflection layer as different layers. First reflection light and second reflection light reflected from the first reflection layer and the second reflection layer, respectively, may destructively interfere with each other so that reflectivity of the external light may be reduced.

A process of forming the antireflection member 30 may be performed continuously after a process of forming the input sensing member 20 is performed. In this case, as illustrated in FIG. 2C, an adhesion member may not be interposed between the antireflection member 30 and the input sensing member 20. In another exemplary embodiment, a process of forming the antireflection member 30 may be performed separately from the process of forming the input sensing member 20. In this case, as illustrated in FIG. 2B, an adhesion member may be interposed between the input sensing member 20 and the antireflection member 30. FIG. 2B illustrates an optically clear adhesive (OCA) as an adhesion member.

The window 40 includes a first transmission portion 41A that corresponds to the display area DA and a second transmission portion 41B that corresponds to the transmission area TA. The window 40 includes a light-shielding portion that corresponds to the non-display area NDA. The window 40 may include a first light-shielding portion 42A that corresponds to the first non-display area NDA1 and a second light-shielding portion 42B that corresponds to the second non-display area NDA2.

The window 40 may include a transparent base layer TPL and a light-shielding pattern layer LBL, as shown in an enlarged view of FIG. 2A. The first and second light-shielding portions 42A and 42B of the window 40 may be defined by the light-shielding pattern layer LBL that overlaps the transparent base layer TPL, and the first and second transmission portions 41A and 41B of the window 40 may be defined as an area of the transparent base layer TPL in which the light-shielding pattern layer LBL does not overlap.

The transparent base layer TPL may include a glass substrate and/or synthetic resin film. The transparent base layer TPL may have a single layer or multi-layer structure. For example, the transparent base layer TPL may include reinforced plastics. The transparent base layer TPL may include two or more films coupled to each other by an adhesive member. The light-shielding pattern layer LBL may include a colored organic layer.

In an exemplary embodiment, the window 40 may be connected to the following components by using an adhesive member such as an OCA, as illustrated in FIGS. 2A through 2C. Alternatively, the window 40 may be formed directly on the following components and thus, may be connected thereto without using an adhesive member.

At least one element of the display device 1 may include an opening that corresponds to the transmission area TA. For example, as illustrated in FIGS. 2A and 2C, the antireflection member 30 may include an opening 30H that corresponds to the transmission area TA, and the OCA may also include an opening OCA-H that corresponds to the transmission area TA. In FIGS. 2A and 2B, the opening OCA-H is formed in each of the OCAs positioned on and under the antireflection member 30 and on and under of the input sensing member 20, respectively. However, in another exemplary embodiment at least one of the OCAs might not include an opening.

A transparent layer 50 may be formed in the opening 30H of the antireflection member 30 and the opening OCA-H of the OCA. The transparent layer 50 may include a transparent material. For example, the transparent material may include an organic material, such as a resin.

Referring to FIG. 2B, the input sensing member 20 between the display panel 10 and the window 40 may include an opening 20H. The opening 20H of the input sensing member 20, the opening 30H of the antireflection member 30, and the opening OCA-H of the OCA may be spatially connected to each other, and a transparent layer 50 may be formed in the openings 20H, 30H, and OCA-H.

The transmission area TA, in which light is transmitted, may be an area in which a component CMP for improving the function of the display device 1 or adding a new function is is to be positioned. For example, the transmission area TA may be an area in which the component CMP using light is positioned. In this regard, FIGS. 2A through 2C illustrate the component CMP positioned under the display panel 10. The component CMP may include electronic elements such as a camera for capturing an image, and/or an optical sensor for recognizing a distance or a fingerprint.

The display area DA, the transmission area TA, and the first and second non-display areas NDA1 and NDA2 of the display device 1 described with reference to FIG. 1 may be understood as areas of the display panel 10. For example, it may be understood that the display panel 10 includes the display area DA, the transmission area TA, and the first and second non-display areas NDA1 and NDA2.

Figure 3:
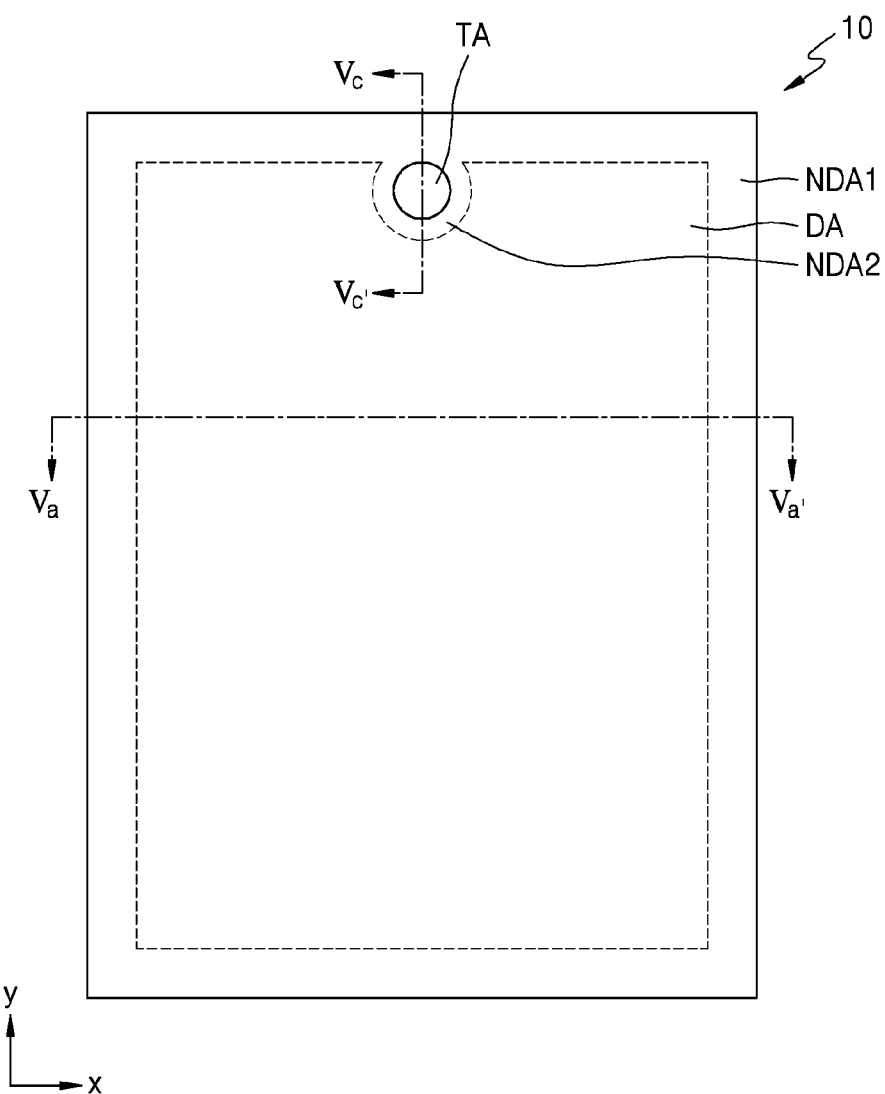
FIG. 3 is a plan view schematically illustrating a display panel according to an exemplary embodiment.

FIG. 3 is a plan view schematically illustrating a display panel according to an exemplary embodiment.

Referring to FIG. 3, the display panel 10 may include a display area DA, a transmission area TA, and first and second non-display areas NDA1 and NDA2. The display panel 10 includes a plurality of pixels arranged in the display area DA. Each of the plurality of pixels includes an organic light-emitting diode (OLED). Each of the OLEDs may emit red, green, blue, or white light.

The display panel 10 includes a transmission area TA, and no pixel is positioned in the transmission area TA, unlike in the display area DA. The transmission area TA is an area in which light is transmitted, and light may pass in a thickness direction of the display panel 10. The transmission area TA may be positioned at one side of the display area DA and may be partially surrounded by the display area DA.

The display area DA and the transmission area TA are surrounded by a non-display area. As mentioned previously, an area that extends along edges of the display panel 10 of the non-display area may be referred to as a first non-display area NDA1, and an area between the display area DA and the transmission area TA may be referred to as a second non-display area NDA2. An upper side of the transmission area TA may be partially surrounded by the first non-display area NDA1, and a lower side of the transmission area TA may be partially surrounded by the second non-display area NDA2, and the first and second non-display areas NDA1 and NDA2 are connected to each other. In FIG. 3, the transmission area TA is positioned at the upper side of the display area DA. However, in another exemplary embodiment, the transmission area TA may be positioned at a left side, a right side and/or a lower side of the display area DA, and the number of transmission areas TA may be two or more.

Figure 4:
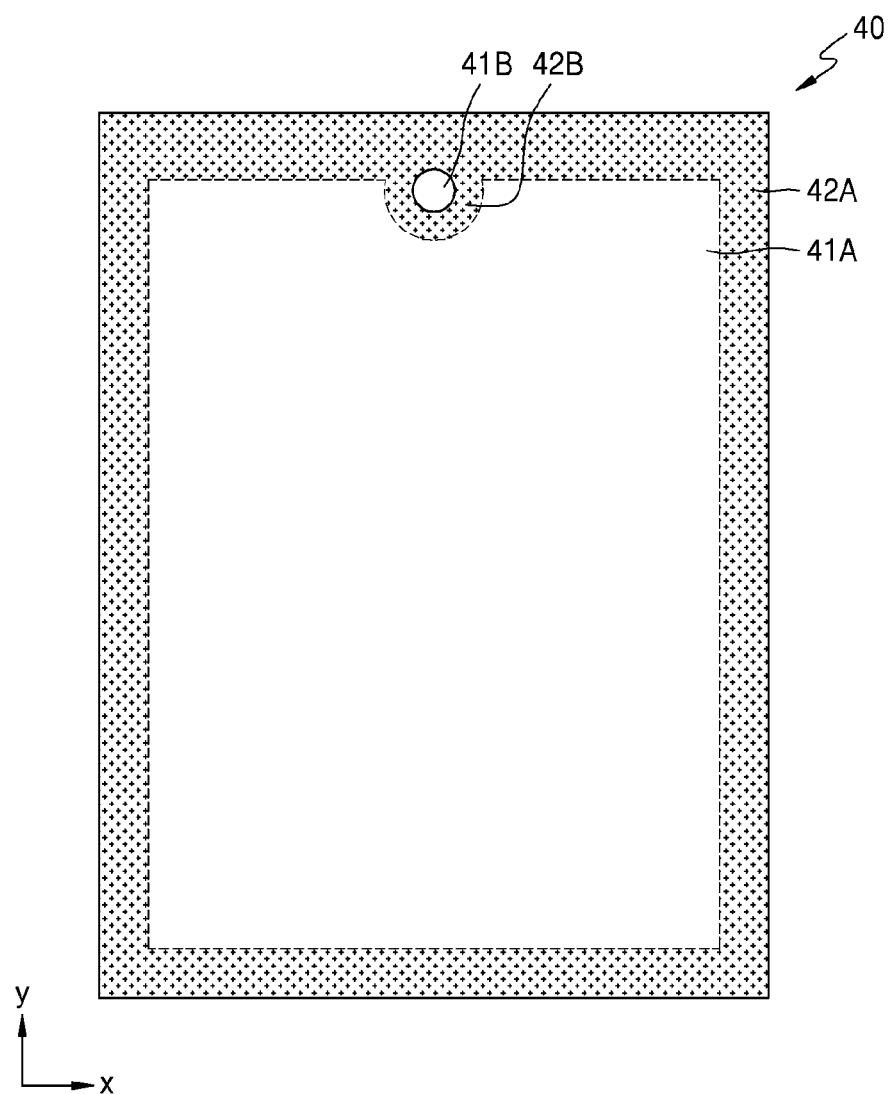
FIG. 4 is a plan view schematically illustrating a window according to an exemplary embodiment.

FIG. 4 is a plan view schematically illustrating a window according to an exemplary embodiment.

Referring to FIG. 4, the window 40 includes a light-shielding portion and a transmission portion. The first transmission portion 41A of the window 40 may have a shape corresponding to the display area DA of the display panel 10 illustrated in FIG. 3, and the second transmission portion 41B of the window 40 may have a shape corresponding to the transmission area TA of the display panel 10 illustrated in FIG. 3.

The light-shielding portion of the window 40 may have a shape corresponding to the first and second non-display areas NDA1 and NDA2 of the display panel 10 illustrated in FIG. 3. For example, the first light-shielding portion 42A of the window 40 may correspond to the first non-display area NDA1, and the second light-shielding portion 42B of the window 40 may correspond to the second non-display area NDA2. The first light-shielding portion 42A of the window 40 may overlap the first non-display area NDA1 of the display panel (see 10 of FIG. 3), and the second light-shielding portion 42B of the window 40 may overlap the second non-display area NDA2.

The first light-shielding portion 42A of the window 40 may extend along edges of the window 40, and the second light-shielding portion 42B of the window 40 may extend in a different direction from the direction of the first light-shielding portion 42A. The second light-shielding portion 42B of the window 40 may surround a lower portion of the second transmission portion 41B partially. The second transmission portion 41B may be completely surrounded by a part of the first light-shielding portion 42A and the second light-shielding portion 42B.

Figure 5A:
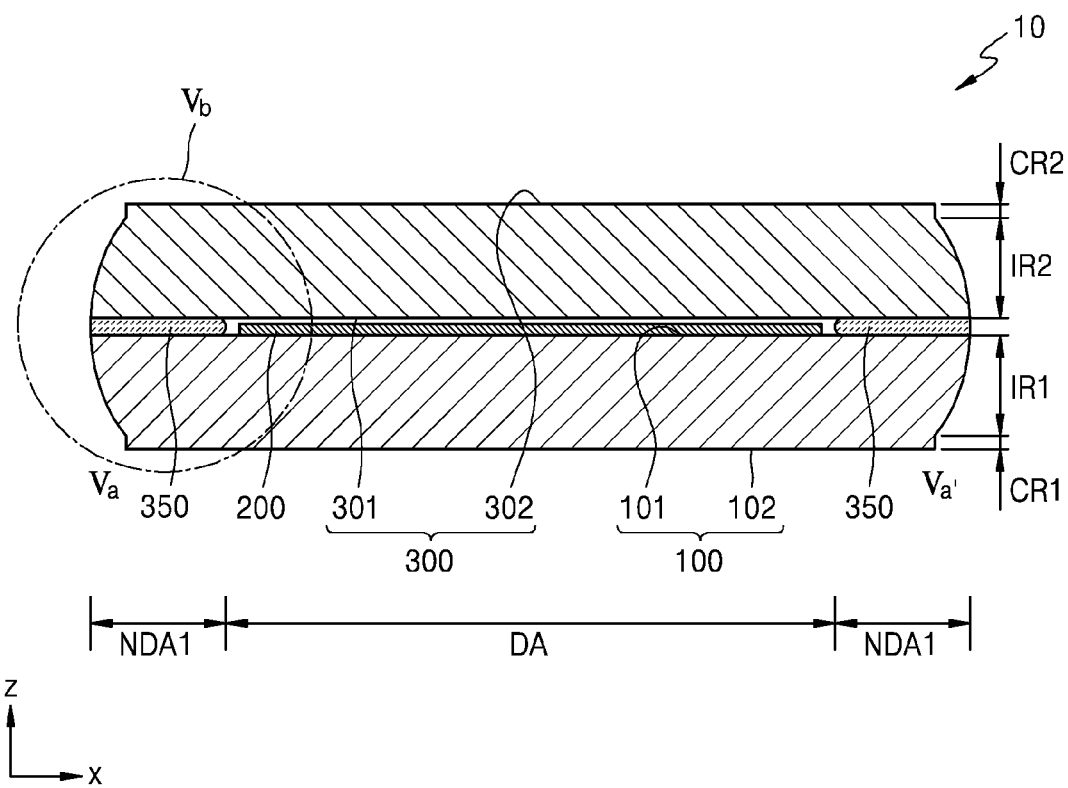
FIG. 5A is a cross-sectional view of a display panel according to an exemplary embodiment.
Figure 5B:
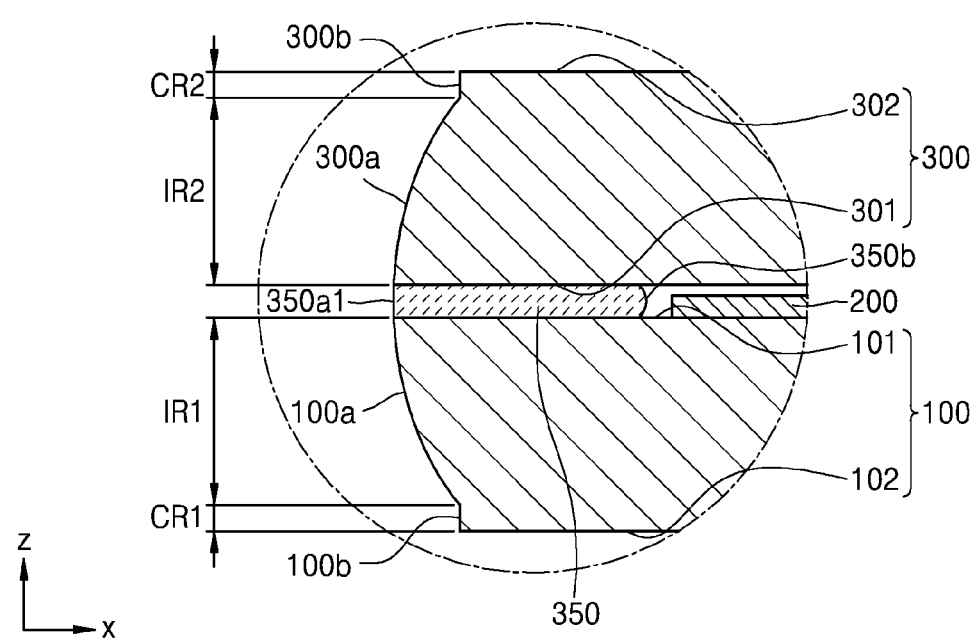
FIG. 5B is an enlarged cross-sectional view of a region Vb of FIG. 5A.
Figure 5C:
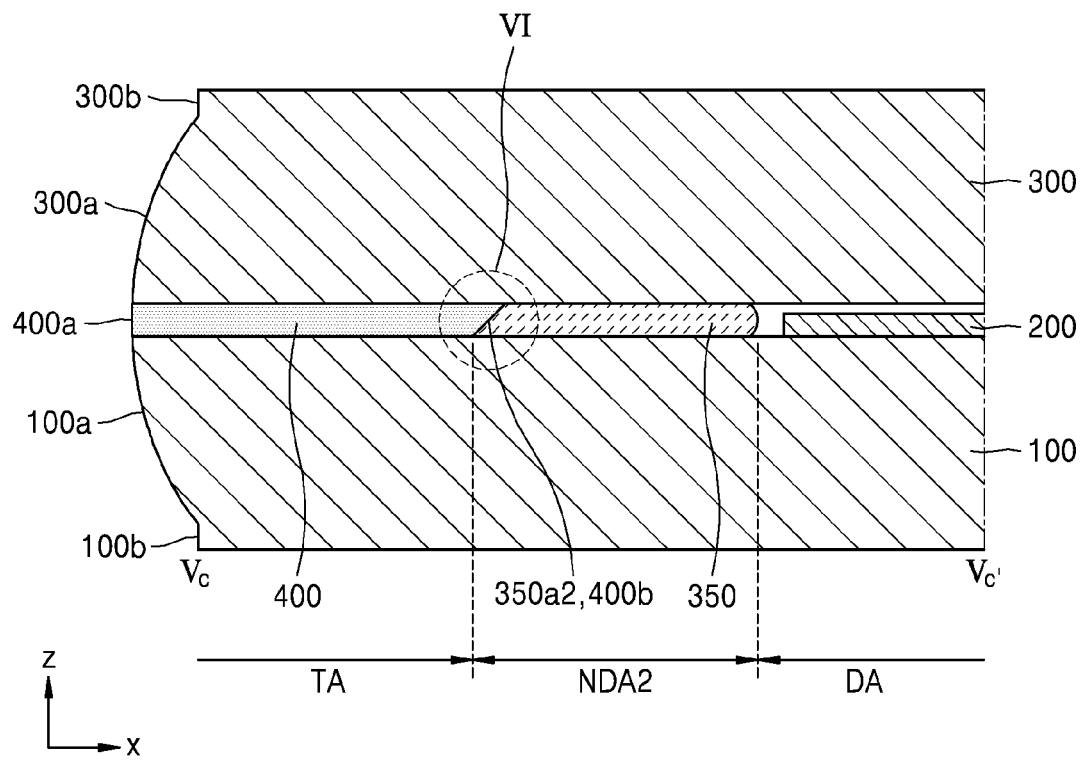
FIG. 5C is a cross-sectional view of a display panel according to an exemplary embodiment.
Figure 5D:
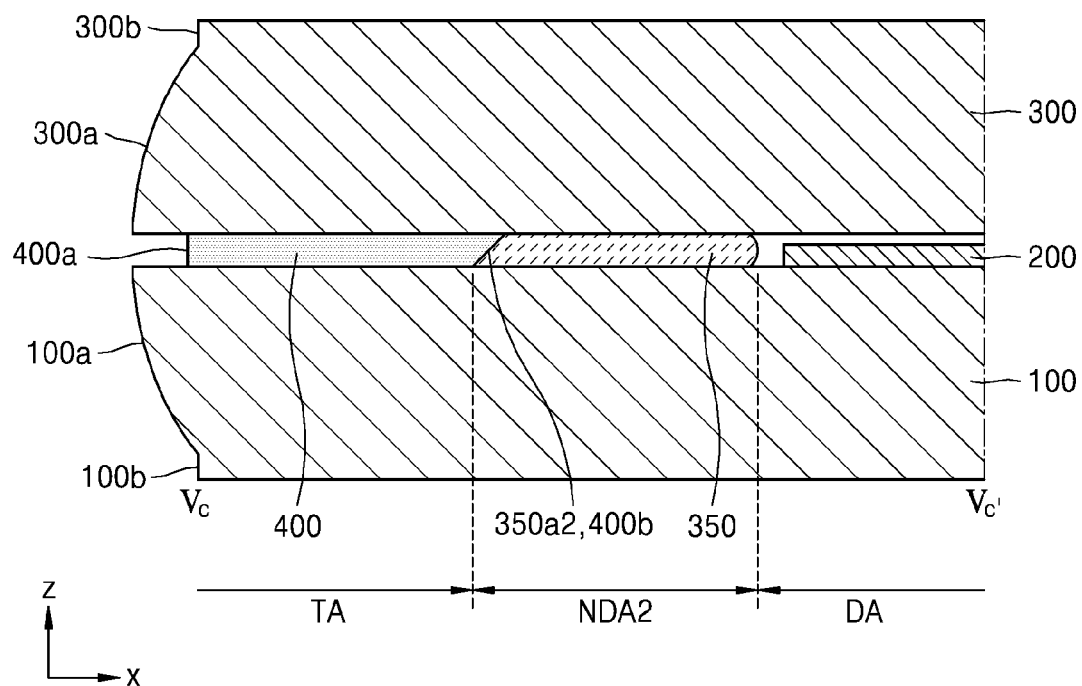
FIG. 5D is a cross-sectional view of a display panel according to another exemplary embodiment.

FIG. 5A is a cross-sectional view of a display panel according to an exemplary embodiment, which corresponds to a cross-section taken along a line Va-Va' of FIG. 3. FIG. 5B is an enlarged cross-sectional view of a region Vb of FIG. 5A. FIG. 5C is a cross-sectional view of a display panel according to an exemplary embodiment. FIG. 5D is a view illustrating a modified version of the exemplary embodiment of FIG. 5C.

Referring to FIG. 5A, the display panel 10 includes a substrate 100. The substrate 100 may include a glass material, reinforced plastics, or the like. The substrate 100 has a first inner surface 101 and a first outer surface 102. The first outer surface 102 may be understood to be an external surface after the substrate 100 is combined to an encapsulation substrate 300 later. That is, the first outer surface 102 corresponds to a surface positioned outside the display panel 10. Here, a side surface of the substrate 100 may be understood to be a surface or a portion for connecting the first inner surface 101 to the first outer surface 102.

A display element unit 200 is positioned on the substrate 100. The display element unit 200 is positioned in the display area DA described with reference to FIG. 3. The display element unit 200 may include a display element, and the display element may include an OLED or a liquid crystal, as described above. The display element unit 200 may include electronic elements, such as a thin-film transistor (TFT) and/or a capacitor, for example, a storage capacitor, in addition to the display element.

The encapsulation substrate 300 may include a glass material and reinforced plastics. The encapsulation substrate 300 has a second inner surface 301 and a second outer surface 302. The second inner surface 301 of the encapsulation substrate 300 faces the first inner surface 101 of the substrate 100.

A sealing member 350 is located between the substrate 100 and the encapsulation substrate 300. The sealing member 350 is located between the first inner surface 101 of the substrate 100 and the second inner surface 301 of the encapsulation substrate 300 so as to surround the display element unit 200 and combines the substrate 100 to the encapsulation substrate 300. The sealing member 350 is located in the first non-display area NDA1 and the second non-display area NDA2 on a plane illustrated in FIG. 3, and a portion of the sealing member 350 located in the first non-display area NDA1 and a portion of the sealing member 350 located in the second non-display area NDA2 may be continuously connected to each other, as described later with reference to FIG. 8. The portion of the sealing member 350 in the first non-display area NDA1 forms a side surface of the display panel 10 and is directed outwardly between the substrate 100 and the encapsulation substrate 300. On the other hand, the portion of the sealing member 350 in the second non-display area NDA2 is located between the substrate 100 and the encapsulation substrate 300 and is not exposed to the outside.

In an exemplary embodiment, the sealing member 350 may have a width of about 200 µm to about 800 µm and the thickness of about 2 µm to about 10 µm. A frit, for example, may be used as the sealing member 350. Frit is a subsidiary material of a glass raw material, and may be cured after being exposed to a laser beam. Frit may be a composition including 15 to 40 wt % of $V_2O_5$, 10 to 30 wt % of $TeO_2$, 1 to 15 wt % of $P_2O_5$, 1 to 15 wt % of BaO, 1 to 20 wt % of ZnO, 5 to 30 wt % of $ZrO_2$, 5 to 20 wt % of $WO_3$, and 1 to 15 wt % of BaO as main ingredients, and at least one of $Fe_2O_3$, CuO, MnO, $Al_2O_3$, $Na_2O$, and $Nb_2O_5$ as an additive. In another exemplary embodiment, the sealing member 350 may include a material such as epoxy.

Referring to FIGS. 3, 5A, and 5B, the substrate 100 may have a first constant portion CR1 having a uniform width in a direction (+y-direction) from the first outer surface 102 to the first inner surface 101 and a first increasing portion IR1 having an increasing width in the direction (+y-direction) from the first outer surface 102 to the first inner surface 101. Here, it will be understood that the width is a length in the x-axis direction in FIGS. 5A and 5B.

The side surface of the substrate 100 may have a first constant side surface 100b that is adjacent to the first outer surface 102 and is approximately perpendicular to the first outer surface 102 and a first increasing side surface 100a that is convex outwardly in a direction (the +y-direction) from the first constant side surface 100b to the first inner side surface 101 of the substrate 100. Here, the first constant side surface 100b refers to a side surface of the first constant portion CR1 of the substrate 100.

The encapsulation substrate 300 may have a second constant portion CR2 having a uniform width in a direction (-y-direction) from the second outer surface 302 to the second inner surface 301 and a second increasing portion IR2 having an increasing width in the direction (-y-direction) from the second outer surface 302 to the second inner surface 301. Here, it will be understood that the width refers to a length in the x-axis direction in FIGS. 5A and 5B.

The side surface of the encapsulation substrate 300 may have a second constant side surface 300b that is adjacent to the second outer surface 302 and is approximately perpendicular to the second outer surface 302 and a second increasing side surface 300a that is convex outwardly in a direction (the –y-direction) from the second constant side surface 300b to the second inner side surface 301 of the substrate 100. Here, the second constant side surface 300b refers to a side surface of the second constant portion CR2 of the encapsulation substrate 300.

The display panel 10 may have a shape in which the side surface of the display panel 10 are overall convex, as illustrated in FIGS. 5A and 5B. When the display panel 10 has the shape in which the side surfaces of the display panel 10 are convex, the probability of damaging the display panel 10 by an external impact may be rapidly lowered as compared to the case where the display panel 10 has a flat shape in which the side surfaces of the display panel 10 are perpendicular to the first outer surface 102 of the substrate 100 or the second outer surface 302 of the encapsulation substrate 300. This is because the side surfaces of the display panel 10 have an overall convex shape, and the effect of an arc structure is shown so that impact resistance, in particular, strength with respect to the side surface impact, is improved. Thus, a display panel having excellent impact resistance may be realized.

The ratio of the first increasing portion IR1 of the substrate 100 with respect to the first constant portion CR1 of the substrate 100 in the (+y-direction) thickness of the substrate 100 may be relatively large. For example, the first constant portion CR1 of the substrate 100 in the (+y-direction) thickness of the substrate 100 may be equal to or less than ½ of the first increasing portion IR1 of the substrate 100. Similarly, the second constant portion CR2 of the encapsulation substrate 300 in the (+y-direction) thickness of the encapsulation 300 may be equal to or less than ½ of the second increasing portion IR2 of the encapsulation substrate 300.

A first outer side surface 350a1 of the sealing member 350 between the substrate 100 and the encapsulation substrate 300 may form a continuous surface with the side surface of the substrate 100 and the side surface of the encapsulation substrate 300. For example, the first outer side surface 350a1 of the sealing member 350 may form a continuous surface with the first increasing side surface 100a of the substrate 100 and the second increasing side surface 300a of the encapsulation substrate 300.

The first outer side surface 350a1 of the sealing member 350 may have a different shape from that of an inner side surface 350b thereof. By performing a process of combining the substrate 100 to the encapsulation substrate 300 using the sealing member 350 and a process of exposing and cutting the substrate 100, the first outer side surface 350a1 and the inner side surface 350b may have different shapes. For example, the inner side surface 350b of the sealing member 350 may be more convex than the first outer side surface 350a1. A curvature radius of the first outer side surface 350a1 may be greater than a curvature radius of the inner side surface 350b.

Referring to FIGS. 3, 5A, and 5B, the sealing member 350 is located between the substrate 100 and the encapsulation substrate 300 so as to entirely surround the display area DA (or the display element unit 200. The sealing member 350 entirely surrounds the display area DA, wherein a portion of the sealing member 350 may be located between the display area DA and the transmission area TA.

Referring to FIGS. 3 and 5C, the sealing member 350 is located between the substrate 100 and the encapsulation substrate 300, wherein a portion of the sealing member 350 may be located inside the display panel 10 from an edge (or a side surface) of the substrate 100 and an edge (or a side surface) the encapsulation substrate 300. That is, a portion of the sealing member 350 is positioned in the second non-display area NDA2 so as to partially surround the transmission area TA. A transparent material layer 400 may be positioned in the transmission area TA.

The transparent material layer 400 may include a transparent (light-transmitting) material, for example, a resin. When the transparent material layer 400 is interposed between the substrate 100 and the encapsulation substrate 300 to correspond to the transmission area TA, light transmissivity may be further improved compared to the case where air is between the substrate 100 and the encapsulation substrate 300. A refractive index of the transparent material layer 400 may be similar to a refractive index of the substrate 100 and/or the encapsulation substrate 300. For example, the refractive index of the transparent material layer 400 may be selected to have a difference of about 0.5 or less between the substrate 100 and/or the encapsulation substrate 300. Alternatively, the refractive index of the transparent material layer 400 may have a difference of about 0.3 or less or 0.2 or less between the substrate 100 or/and the encapsulation substrate 300.

The transparent material layer 400 may be located between the substrate 100 and the encapsulation substrate 300 and exposed to the outside, as illustrated in FIGS. 5C and 5D. The transparent material layer 400 may be formed by combining the substrate 100 to the encapsulation substrate 300 using the sealing member 350 and then injecting a transparent material between the substrate 100 and the encapsulation substrate 300 and hardening the transparent material.

In an exemplary embodiment, an outer side surface 400a of the transparent material layer 400 may form a continuous surface with outer side surfaces of the substrate 100 and the encapsulation substrate 300. In this regard, FIG. 5C illustrates that the outer side surface 400a of the transparent material layer 400 is continuous with the first increasing side surface 100a of the substrate 100 and the second increasing side surface 300a of the encapsulation substrate 300. In another exemplary embodiment, according to the quantity of injection of the transparent material in a process of forming the transparent material layer 400, the outer side surface 400a of the transparent material layer 400 may not be aligned with the first increasing side surface 100a of the substrate 100 and the second increasing side surface 300a of the encapsulation substrate 300. In this regard, FIG. 5D illustrates that the outer side surface 400a of the transparent material layer 400 is located at an inner position than the first increasing side surface 100a of the substrate 100 and the second increasing side surface 300a of the encapsulation substrate 300, i.e., closer to the display element unit 200.

The transparent material layer 400 may be in direct contact with the sealing member 350. The second outer side surface 350a2 of the portion of the sealing member 350 located in the second non-display area NDA2 may be in direct contact with the inner side surface 400b of the transparent material layer 400. In this regard, FIGS. 5C and 5D illustrate that the inner side surface 400b of the transparent material layer 400 and the second outer side surface 350a2 of the sealing member 350 form substantially the same surface. Here, the inner side surface 400b of the transparent material layer 400 represents a surface facing the second outer side surface 350a2 around the transmission area TA.

Referring to FIGS. 5A through 5C, the second outer side surface 350a2 of the portion, which is located in the second non-display area NDA2, of the sealing member 350 (hereinafter, referred to as a second portion) may have a different shape from that of the first outer side surface 350a1 of the sealing member 350 of a portion located in the first non-display area NDA1 (hereinafter, referred to as a first portion).

For example, the first outer side surface 350a1 of the first portion of the sealing member 350 may be a round surface having a large radius of curvature (or substantially flat surface when the radius of curvature of the sealing member 350 is very large), as illustrated in FIG. 5B. On the other hand, the second outer side surface 350a2 of the second portion of the sealing portion 350 may have a different shape from that of the first outer side surface 350a1, an inclined surface, as illustrated in FIGS. 5C and 5D. In another exemplary embodiment, the second outer side surface 350a2 of the second portion of the sealing member 350 may be a curved surface or a surface having an inflection point. This will be described with reference to FIGS. 6A through 6D.

FIGS. 6A through 6D are cross-sectional views of a display device according to exemplary embodiments, which may correspond to a region VI of FIG. 5C.

In a process of combining the substrate 100 to the encapsulation substrate 300 using the sealing member 350, the second outer side surface 350a2 of the second portion of the sealing member 350 may have various shapes according to the type, content, and a hardening condition of a material for forming the sealing member 350. Alternatively, when a structure WSM including a wiring or inorganic insulating layer is provided on the substrate 100, as illustrated in FIGS. 6A through 6D that will be described later, flow or diffusion of the material for forming the sealing member 350 between the substrate 100 and the encapsulation substrate 300 is changed so that the second outer side surface 350a2 of the second portion of the sealing member 350 has various shapes.

Figure 6A:
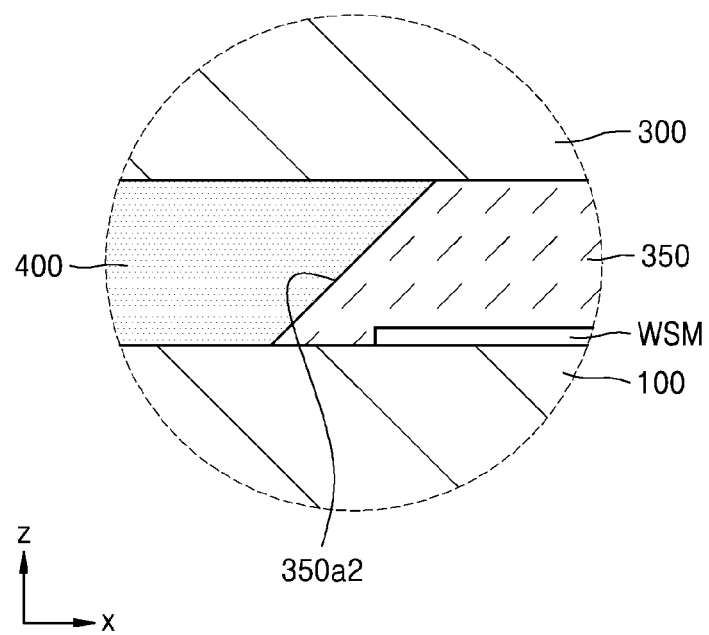
FIGS. 6A, 6B, 6C, and 6D are cross-sectional views of a display device according to exemplary embodiments, which correspond to a region VI of FIG. 5C.
Figure 6B:
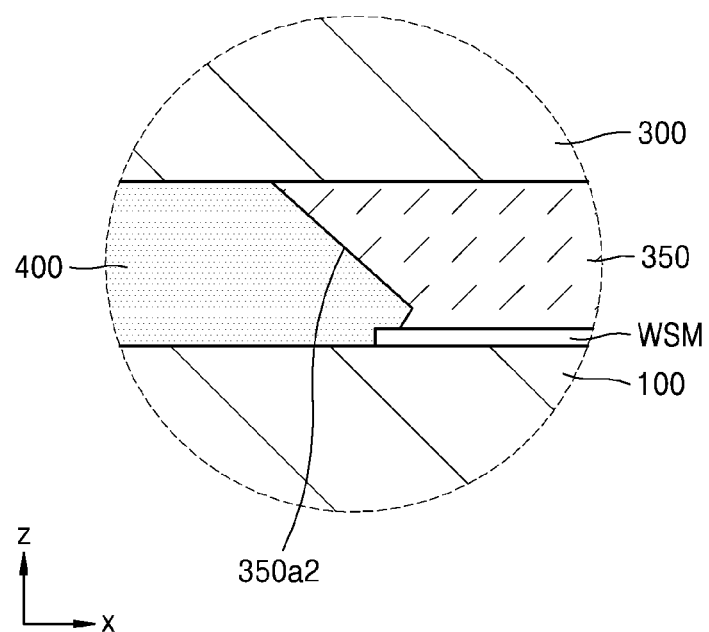
Figure 6C:
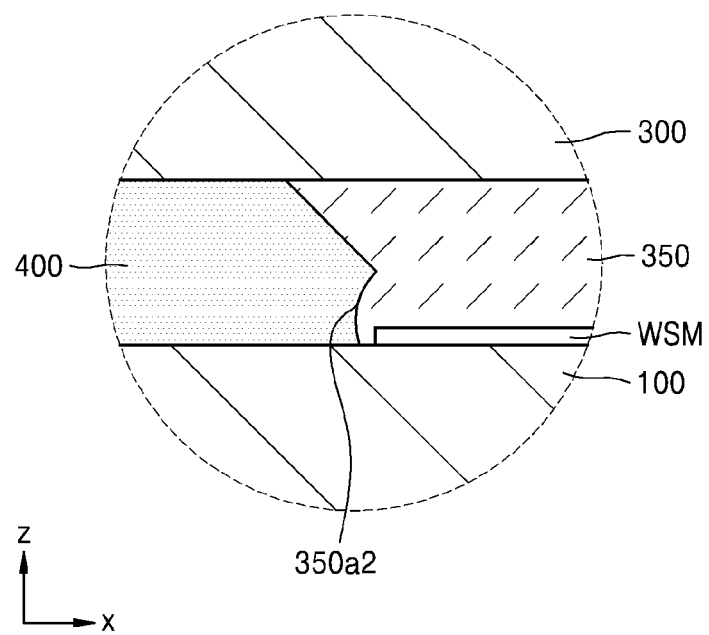
Figure 6D:
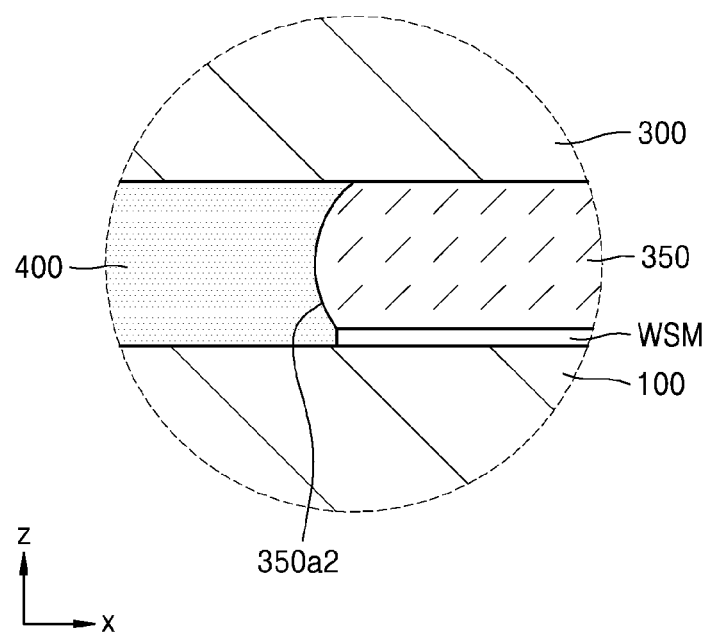

Referring to FIG. 6A, the second outer side surface 350a2 of the second portion of the sealing member 350 may have a comparatively gentle inclined surface from a portion in which the inclined surface is in contact with the substrate 100 toward a portion in which the inclined surface is in contact with the encapsulation substrate 300. Alternatively, the second outer side surface 350a2 of the second portion of the sealing member 350 has a comparatively gentle inclination from the portion contacting the substrate 100 toward the encapsulation substrate 300 and changes its direction at a predetermined point and is in contact with the encapsulation substrate 300, as illustrated in FIGS. 6B and 6C. Alternatively, the second outer side surface 350a2 of the second portion of the sealing member 350 may have various shapes, including a convex shape between the substrate 100 and the encapsulation substrate 300, as illustrated in FIG. 6D.

Figure 7:
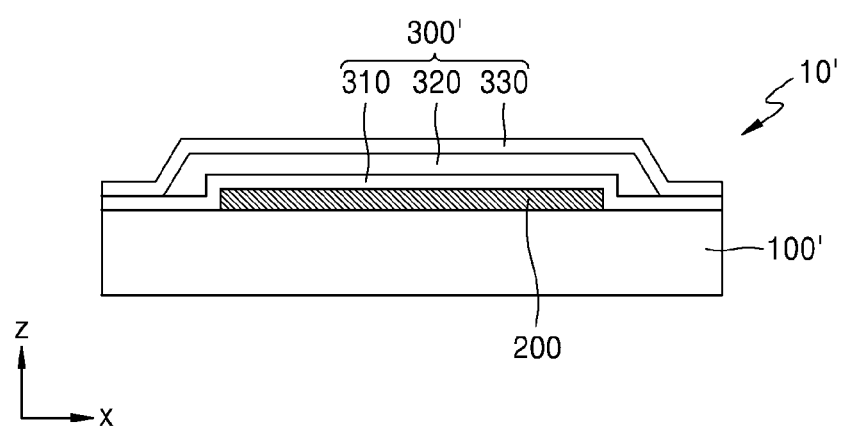
FIG. 7 is a cross-sectional view schematically illustrating a display panel according to another exemplary embodiment.

FIG. 7 is a cross-sectional view schematically illustrating a display panel according to another exemplary embodiment. The cross-section of FIG. 7 may correspond to a cross-section taken along a line Va-Va' of FIG. 3. The display panel 10 described with reference to FIG. 5A includes the encapsulation substrate 300 that is an encapsulation member and includes a glass material. However, a display panel 10' illustrated in FIG. 7 may include an encapsulation member including an organic insulating material and inorganic insulating material.

Referring to FIG. 7, the display panel 10' includes an encapsulation member that covers the display element unit 200 positioned on a substrate 100'. The substrate 100' may have a multi-layer structure including a base layer including a transparent polymer resin and an inorganic layer, such as silicon nitride. The encapsulation member may include a thin-film encapsulation layer 300' including at least one inorganic encapsulation layer and at least one organic encapsulation layer.

In an exemplary embodiment, the thin-film encapsulation layer 300' may include first and second inorganic encapsulation layers 310 and 330 and an organic encapsulation layer 320 therebetween. The first and second inorganic encapsulation layers 310 and 330 may include one or more inorganic insulating materials, such as silicon oxide, silicon nitride, and silicon oxynitride. The organic encapsulation layer 320 may include a polymer-based material. The polymer-based material may include an acryl-based resin, an epoxy-based resin, polyimide, and polyethylene. For example, the organic encapsulation layer 320 may include a polymethylmethacrylate (PMMA), or a polyacrylic acid, etc. When the display element unit 200 includes an OLED, the thin-film encapsulation layer 300' may be formed directly on the OLED.

Figure 8:
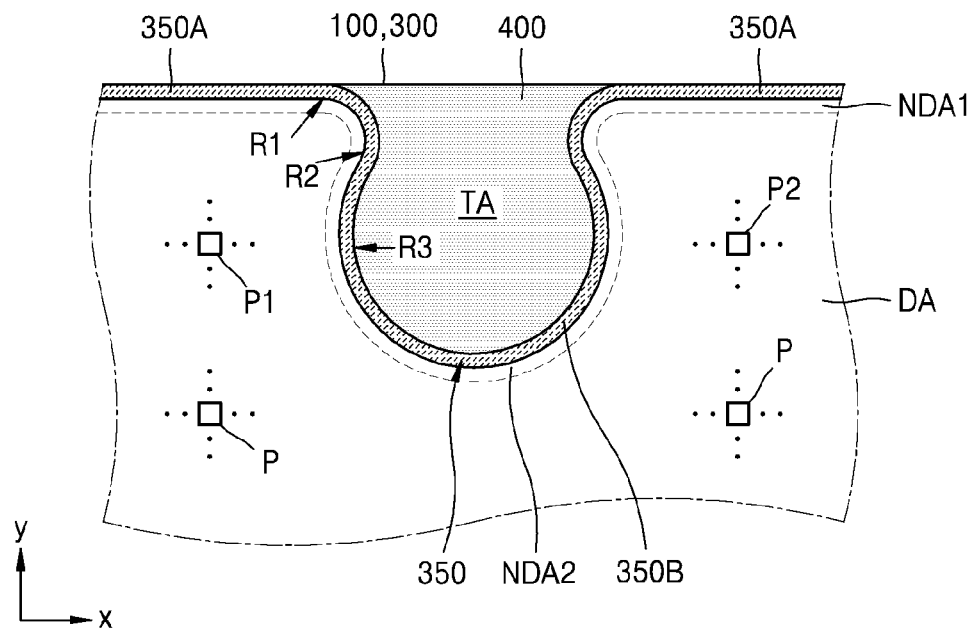
FIG. 8 is a plan view of a part of a display panel according to an exemplary embodiment.
Figure 9:
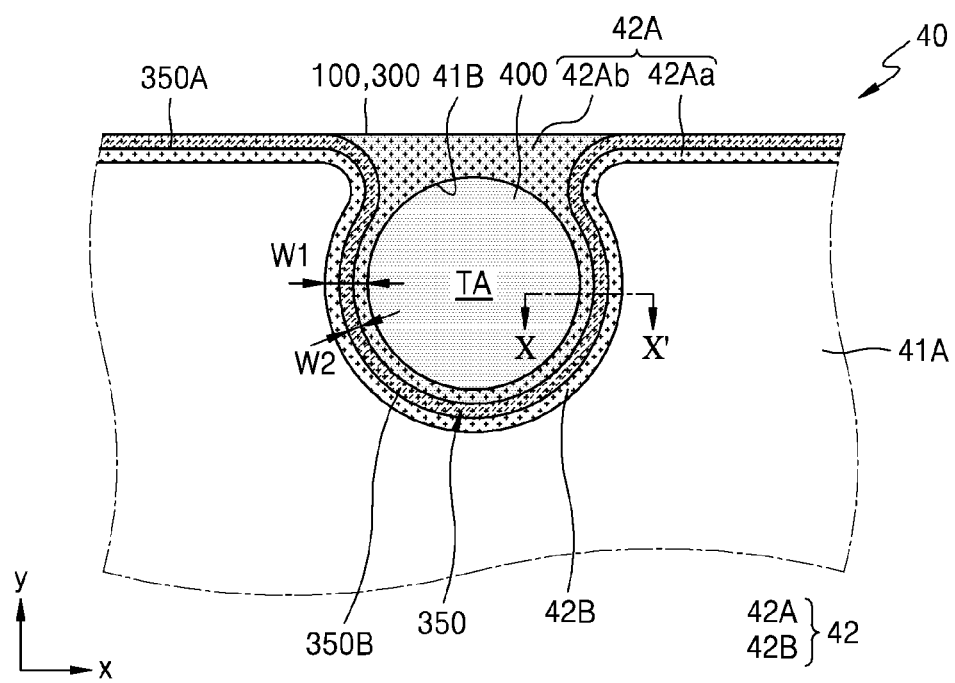
FIG. 9 is a plan view illustrating a state where a window is positioned on the display panel of FIG. 8.

FIG. 8 is a plan view of a part of a display panel according to an exemplary embodiment, and FIG. 9 is a plan view illustrating a state where a window is positioned on the display panel of FIG. 8.

Referring to FIG. 8, the sealing member 350 includes a portion 350A (the first portion described with reference to FIG. 5A) that extends along edges of the substrate 100 and the encapsulation substrate 300 and a portion 350B (the second portion described with reference to FIG. 5C) that partially surrounds the transmission area TA. The first portion 350A and the second portion 350B may be connected to each other and may have approximately an omega (Ω) shape in which one side of each of the first portion 350A and the second portion 350B is open.

Because the transparent material layer 400 is located in the transparent area TA, the second portion 350B of the sealing member 350 surrounds a portion of the transparent material layer 400. In a plan view of FIG. 8, a lower side of the transparent material layer 400 is surrounded by the second portion 350B while being in contact with the second portion 350B of the sealing member 350, but an upper side of the transparent material layer 400 is not surrounded by the sealing member 350.

In a plan view, the sealing member 350 may have a smooth curve portion. The second portion 350B may have a shape of an arc having overall a third curvature radius R3. Parts of the second portion 350B that are connected to the first portion 350A may be curved to have a first curvature radius R1 and a second curvature radius R2, respectively. Centers of the first curvature radius R1 and the second curvature radius R2 may be the same or different. A center of the third curvature radius R3 is different from the centers of the first curvature radius R1 and the second curvature radius R2. Thus, the second portion 350B may have a shape of a curve with at least one inflection point.

The transparent area TA is partially surrounded by the display area DA. That is, a pixel array including a plurality of pixels P may partially surround the transmission area TA. A first pixel P1 and a second pixel P2 arranged in an imaginary line that passes through the transmission area TA among the plurality of pixels P may be spaced apart from each other while the transmission area TA is between the first pixel P1 and the second pixel P2.

Referring to FIG. 9, the light-shielding portion 42 of the window 40 overlaps the sealing member 350. A width W1 of the light-shielding portion 42 may be greater than a width W2 of the sealing member 350. In a plan view, unlike the sealing member 350 partially surrounding the transparent material layer 400, the light-shielding portion 42 may entirely surround the transparent material layer 400. The light-shielding portion 42 includes a first light-shielding portion 42A that extends along edges of the substrate 100 continuously and a second light-shielding portion 42B that extends from the first light-shielding portion 42A and defines the second light-shielding portion 42B together with the first light-shielding portion 42A.

The first light-shielding portion 42A may include a first sub-light-shielding portion 42Aa that overlaps the first portion 350A of the sealing member 350 and a second sub-light-shielding portion 42Ab that does not overlap the sealing member 350. The transparent material layer 400 may be located directly under the second sub-light-shielding portion 42Ab. The second sub-light-shielding portion 42Ab may be connected to the second light-shielding portion 42B and define the second transmission portion 41B.

Figure 10:
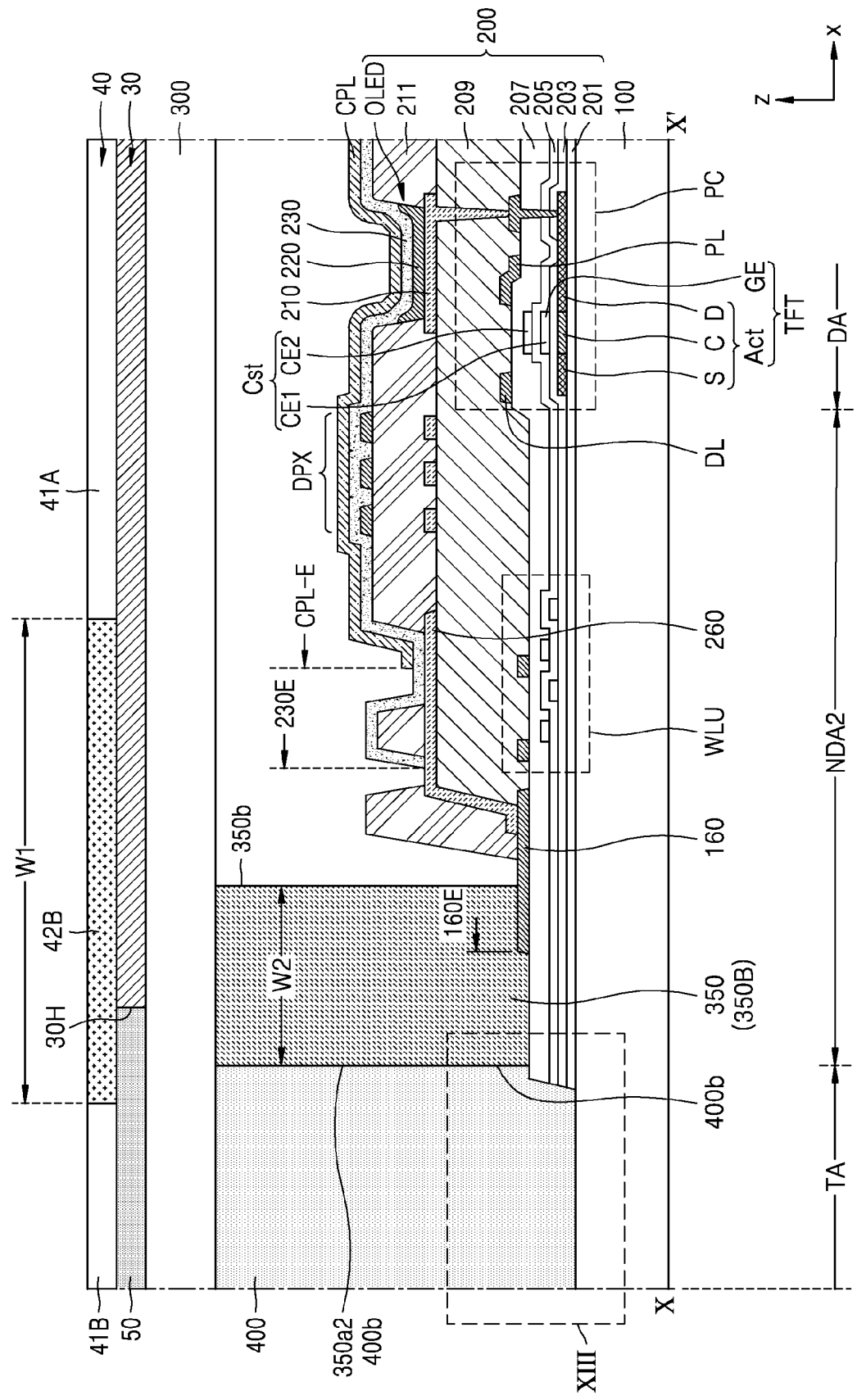
FIG. 10 is a cross-sectional view of a display device according to an exemplary embodiment.
Figure 11:
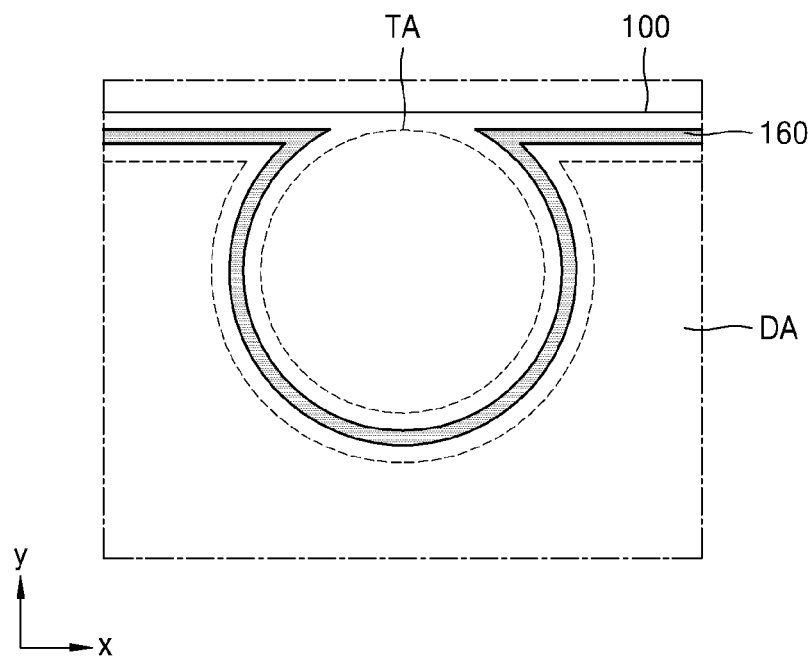
FIGS. 11 and 12 are plan views illustrating wirings positioned in a second non-display area of a display panel according to an exemplary embodiment.
Figure 12:
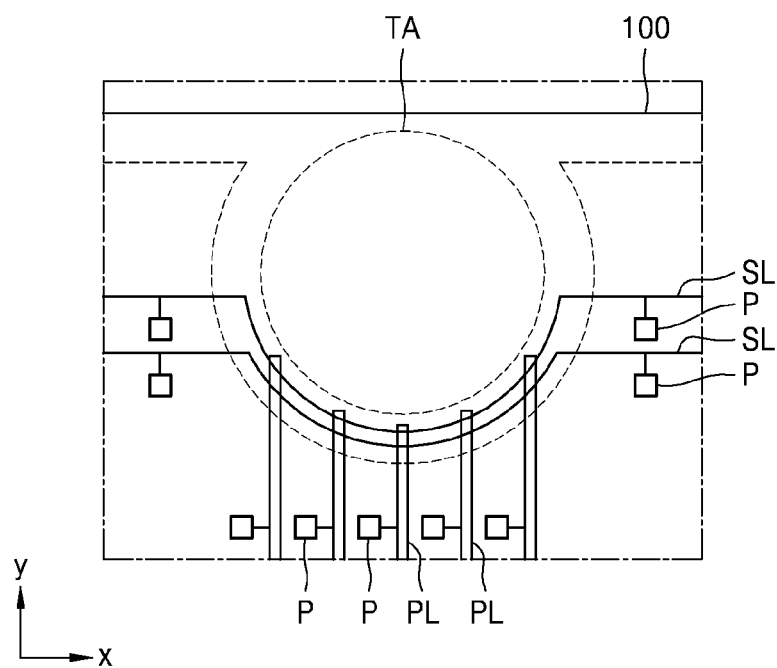

FIG. 10 is a cross-sectional view of a display device according to an exemplary embodiment, which corresponds to a cross-section taken along a line X-X' of FIG. 9, and FIGS. 11 and 12 are plan views illustrating wirings positioned in a second non-display area of a display panel according to an exemplary embodiment. In detail, FIG. 11 illustrates a power line located in the second non-display area, and FIG. 12 illustrates signal lines. In FIG. 10, for convenience, the antireflection member 30 and the window 40 are positioned on the encapsulation substrate 300. In some exemplary embodiments, the input sensing member described previously with reference to FIG. 2A and the adhesion member may be further positioned between the encapsulation substrate 300 and the window 40. For convenience, FIG. 10 illustrates a sealing member having a rectangular shape. However, an outer side surface and an inner side surface of the sealing member may have the shape described previously with reference to FIGS. 5A through 6D.

First, a display area DA of FIG. 10 will be described.

The display element unit (section) 200 is positioned on the substrate 100. The display element unit 200 includes pixels. In this regard, FIG. 10 illustrates that the display element unit 200 includes a pixel including a pixel circuit PC and an OLED connected thereto. The pixel circuit PC may include a TFT and a storage capacitor Cst.

A buffer layer 201 is between the substrate 100 and the TFT. The buffer layer 201 may block foreign substances or moisture that permeates into the display panel through the substrate 100. For example, the buffer layer 201 may include an inorganic material such as silicon oxide, silicon nitride, and/or silicon oxynitride, and may have a single layer or multi-layer structure.

The TFT may include a semiconductor layer Act and a gate electrode GE. The semiconductor layer Act may include polysilicon, for example. The semiconductor layer Act may include a channel region C that overlaps the gate electrode GE and a source region S and a drain region D, which are positioned at both sides of the channel region C and include impurities having a higher concentration than that of the channel region C. It will be understood that the source region S and the drain region D are a source electrode and a drain electrode of the TFT.

A gate insulating layer 203 may be positioned between a semiconductor layer Act and a gate electrode GE. The gate insulating layer 203 may be an inorganic insulating layer such as silicon oxynitride, silicon oxide, and/or silicon nitride, and the inorganic insulating layer may have a single layer or multi-layer structure.

The storage capacitor Cst includes first and second storage capacitor plates CE1 and CE2 that overlap each other. A first interlayer insulating layer 205 may be positioned between the first and second storage capacitor plates CE1 and CE2. The first interlayer insulating layer 205 may be an inorganic insulating layer including silicon nitride and may have a single layer or multi-layer structure. In FIG. 10, the storage capacitor Cst overlaps the TFT, and the first storage capacitor plate CE1 is the gate electrode GE of the TFT. However, embodiments are not limited thereto. In another exemplary embodiment, the storage capacitor Cst may not overlap the TFT. The storage capacitor Cst may not overlap the TFT. The first storage capacitor plate CE1 may be a separate independent element from the gate electrode GE of the TFT.

The storage capacitor Cst may be covered by a second interlayer insulating layer 207. The second interlayer insulating layer 207 may be an inorganic insulating layer including silicon oxide and silicon nitride and may have a single layer or multi-layer structure.

A data line DL and a driving voltage line PL may be positioned on the second interlayer insulating layer 207 and may be covered by a planarization insulating layer 209. The planarization insulating layer 209 includes an organic insulating material. For example, the polarization insulating layer 209 may include polyimide.

A pixel electrode 210 is positioned on the planarization insulating layer 209. The pixel electrode 210 may be electrically connected to the pixel circuit PC through a contact hole that passes through the planarization insulating layer 209. The pixel electrode 210 is a reflection electrode. The pixel electrode 210 may include a reflection layer including silver (Ag), magnesium (Mg), aluminum (Al), platinum (Pt), palladium (Pd), gold (Au), nickel (Ni), neodymium (Nd), iridium (Ir), and chromium (Cr). The pixel electrode 210 may further include a transparent conductive layer such as indium tin oxide (ITO) positioned on or/and under the above-described reflection layer.

A pixel-defining layer 211 is positioned on the pixel electrode 210. The pixel-defining layer 211 has an opening for exposing the center of the pixel electrode 210. The pixel-defining layer 211 increases a distance between edges of the pixel electrode 210 and an opposite electrode 230, thereby preventing arc from occurring therebetween. The pixel-defining layer 211 may be formed of an organic material, such as polyimide or hexamethyldisiloxane (HMDSO).

An intermediate layer 220 may include a small molecular weight material or a polymer material. When the intermediate layer 220 includes a small molecular weight material, the intermediate layer 220 may have a structure in which a hole injection layer (HIL), a hole transport layer (HTL), an emission Layer (EML), an electron transport layer (ETL) and/or an electron injection layer (EIL) are stacked in a single or composite manner. When the intermediate layer 220 includes a polymer material, the intermediate layer 220 may have a structure including a HTL and an EML.

The structure of the intermediate layer 220 is not limited to the above description, and the intermediate layer 220 may have various structures. At least one among layers for forming the intermediate layer 220 may be formed as one body in the display area DA. The opposite electrode 230 is positioned on the intermediate layer 220. The opposite electrode 230 may be formed as one body so as to cover a plurality of pixels. The opposite electrode 230 may be a light-transmitting conductive layer including Ag, Mg, Al, Pt, Pd, Au, Ni, Nd, Ir, Cr, lithium (Li), calcium (Ca), or an alloy thereof. The OLED including the pixel electrode 210, the intermediate layer 220, and the opposite electrode 230 may be covered by a capping layer CPL.

Dummy pixels DPX and a sealing member 350 may be positioned in the second non-display area NDA2. The sealing member 350 may be positioned outside the dummy pixels DPX in the second non-display area NDA2 and between the dummy pixels DPX and the transmission area TA. Various components for applying power or signals may be provided in the second non-display area NDA2. For example, a wiring unit WLU including a power line 160 and a plurality of lines may be positioned in the second non-display area NDA2.

The power line 160 may provide a predetermined voltage to the opposite electrode 230. The power line 160 may be positioned on the same layer (the second interlayer insulating layer 207) as the data line DL or the driving voltage line PL, as illustrated in FIG. 10 and may be electrically connected to the opposite electrode 230 via a connection conductive layer 260.

The power line 160 may extend along edges of the display area DA, as illustrated in FIG. 11, and may partially surround the transmission area TA, such as in the sealing member 350. The plurality of lines of the wiring unit WLU may correspond to parts of driving voltage lines PL that extend in the second non-display area NDA2 illustrated in FIG. 12 and/or parts of scan lines SL that extend in the second non-display area NDA2. The parts of the driving voltage lines PL and the part of the scan lines SL may overlap each other so that a load of the display element unit 200 may be adjusted.

The sealing member 350 may be positioned on the power line 160. The sealing member 350 may at least partially overlap the power line 160. An end 160E of the power line 160 may be located between the second outer side surface 350a2 and the inner side surface 350b of the second portion 350B of the sealing member 350.

The antireflection member 30 may include an opening 30H that corresponds to the transmission area TA. A transparent layer 50 may be positioned in the opening 30H, as described above. Side surfaces of the antireflection member 30 for defining the opening 30H may be positioned between the inner side surface 350b and the second outer side surface 350a2 of the sealing member 350 in a direction perpendicular to the substrate 100.

A light-shielding portion of the window 40, for example, the second light-shielding portion 42B may overlap the sealing member 350, as described above. Because a width W1 of the second light-shielding portion 42B is greater than a width W2 of the sealing member 350, the sealing member 350 is not visible when the window 40 is seen in the direction perpendicular to the substrate 100. The light-shielding portion, for example, the second light-shielding portion 42B may cover the end 230E of the opposite electrode 230 and an end CPL-E of the capping layer CPL.

The transparent material layer 400 may be positioned in the transmission area TA and may be in direct contact with the second outer side surface 350a2 of the sealing member 350. The transparent material layer 400 may be positioned between the substrate 100 and the encapsulation substrate 300, and a top surface of the transparent material layer 400 may be in direct contact with a bottom surface of the encapsulation substrate 300. The bottom surface of the transparent material layer 400 may or may not be in contact with the top surface of the substrate 100.

Figure 13A:
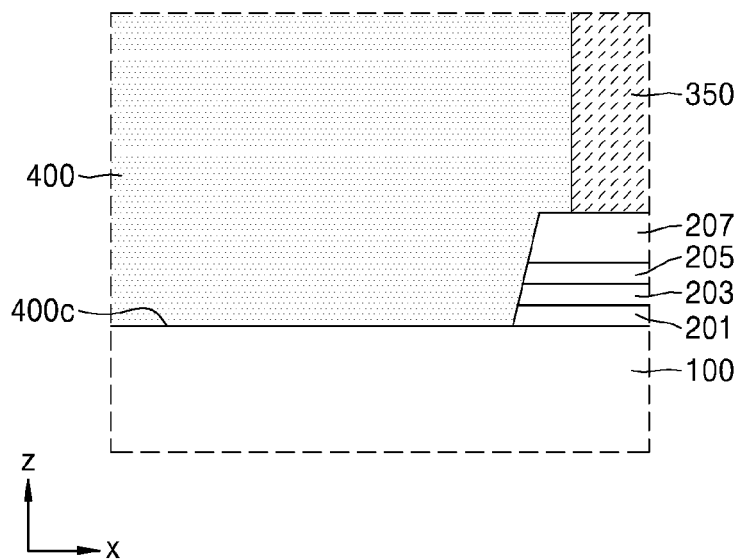
FIGS. 13A and 13B are extracted cross-sectional views of a region XIII of FIG. 10.
Figure 13B:
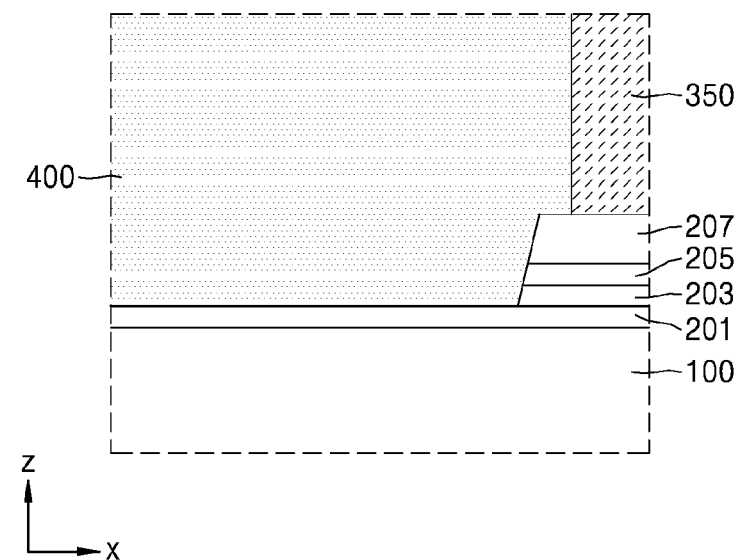

FIGS. 13A and 13B are extracted cross-sectional views of a region XIII of FIG. 10.

Referring to FIGS. 10 and 13A, insulating layers, for example, the buffer layer 201 through the second interlayer insulating layer 207, may be removed from a region of the substrate 100 that corresponds to the transmission area TA. Thus, transmissivity of the transmission area TA may be improved compared to the case where the above-described insulating layers are present. A bottom surface 400c of the transparent material layer 400 may be in direct contact with the top surface of the substrate 100.

Referring to FIGS. 10 and 13B, a part of the insulating layers that correspond to the buffer layer 201 through the second interlayer insulating layer 207, for example, a part of the buffer layer 201, may be positioned in the region of the substrate 100 that corresponds to the transmission area TA. If the part of the buffer layer 201 remains in the transmission area TA, transmissivity may be reduced compared to the case of FIG. 13A. However, when the thickness of the buffer layer 201 is very small or a refractive index thereof is similar to the refractive index of the substrate 100 and/or the transparent material layer 400, a reduction in transmissivity may be small. In this case, the transparent material layer 400 is not in direct contact with the top surface of the substrate 100.

According to exemplary embodiments, transmissivity of a transmission area may be improved, and the transmission area may be formed while a process of forming a hole in a display panel is not performed. Thus, components around the transmission area may be prevented from being damaged. However, these effects are illustrative, and the inventive concepts are not so limited.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate;
    a plurality of pixels on the substrate, the plurality of pixels arranged in a display area;
    a sealing member surrounding the display area, a part of the sealing member being located between the display area and a transmission area, wherein the transmission area is between adjacent pixels arranged in a first direction, and the sealing member partially surrounds the transmission area;
    an encapsulation substrate facing the substrate with the sealing member between the encapsulation substrate and the substrate; and
    a transparent material layer disposed between the substrate and the encapsulation substrate and corresponding to the transmission area,
    wherein:
    the sealing member comprises an inner side surface facing the display area and a first outer side surface which faces the transmission area; and
    the first outer side surface of the sealing member is spaced apart from an edge of the substrate in a second direction crossing the first direction, and the transparent material layer is located between the edge of the substrate and the first outer side surface of the sealing member in the second direction.

2. The display device of claim 1, wherein the transparent material layer comprises an inner side surface facing the first outer side surface of the sealing member, and the transparent material layer is in contact with the first outer side surface of the sealing member.

3. The display device of claim 1, further comprising a window on the encapsulation substrate and including a light-shielding portion that corresponds to the sealing member.

4. The display device of claim 3, wherein a width of the light-shielding portion is greater than a width of the sealing member.

5. The display device of claim 3, wherein the window has a first transmission portion that corresponds to the transmission area and a second transmission portion that corresponds to the display area, and
    wherein the first and second transmission portions are spatially separated from each other.

6. The display device of claim 1, wherein the transparent material layer is in direct contact with at least one of the substrate and the encapsulation substrate.

7. The display device of claim 1, wherein a difference between a refractive index of the transparent material layer and a refractive index of the substrate is about 0.5 or less.

8. The display device of claim 1, wherein a difference between a refractive index of the transparent material layer and a refractive index of the encapsulation substrate is about 0.5 or less.

9. The display device of claim 1, wherein the adjacent pixels comprise a first pixel and a second pixel with the transmission area therebetween, and a line electrically connected to the first and second pixels bypasses around the transmission area.

10. A display device comprising:
    a substrate;
    a plurality of pixels on the substrate, the plurality of pixels arranged in a display area and including a first pixel and a second pixel, which are arranged in a first direction with a transmission area therebetween;
    an encapsulation substrate facing the substrate;
    a transparent material layer disposed between the substrate and the encapsulation substrate and corresponding to the transmission area; and
    a sealing member between the substrate and the encapsulation substrate, a part of the sealing member is between the display area and the transmission area,
    wherein the transparent material layer is partially surrounded by the part of the sealing member.

11. The display device of claim 10, wherein the sealing member comprises an inner side surface facing the display area and a first outer side surface which faces the transmission area, and
    wherein the first outer side surface of the sealing member is spaced apart from an edge of the substrate in a second direction crossing the first direction such that the transparent material layer is located between the edge of the substrate and the first outer side surface of the sealing member in the second direction.

12. The display device of claim 11, wherein the transparent material layer comprises an inner side surface facing the first outer side surface of the sealing member, and the transparent material layer is in contact with the first outer side surface of the sealing member.

13. The display device of claim 10, further comprising a window on the encapsulation substrate and including a light-shielding portion that corresponds to the sealing member.

14. The display device of claim 13, wherein a width of the light-shielding portion is greater than a width of the sealing member.

15. The display device of claim 13, wherein the window having a first transmission portion that corresponds to the transmission area and a second transmission portion that corresponds to the display area, and
    wherein the first and second transmission portions are spatially separated from each other.

16. The display device of claim 13, wherein the sealing member partially surrounds the transmission area, and the light shielding portion entirely surrounds the first transmission portion.

17. The display device of claim 10, wherein the transparent material layer is in direct contact with at least one of the substrate and the encapsulation substrate.

18. The display device of claim 10, wherein a difference between a refractive index of the transparent material layer and a refractive index of the encapsulation substrate is about 0.5 or less.

19. The display device of claim 10, wherein the adjacent pixels comprises a first pixel and a second pixel with the transmission area therebetween, and a line electrically connected to the first and second pixels bypasses around the transmission area.

20. The display device of claim 10, further comprising a line electrically connected to the first and second pixels bypasses around the transmission area.

* * * * *